(12) United States Patent
Moore et al.

(10) Patent No.: US 7,385,868 B2
(45) Date of Patent: Jun. 10, 2008

(54) METHOD OF REFRESHING A PCRAM MEMORY DEVICE

(75) Inventors: John T. Moore, Boise, ID (US); Terry L. Gilton, Boise, ID (US); Kristy A. Campbell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 336 days.

(21) Appl. No.: 11/128,177

(22) Filed: May 13, 2005

(65) Prior Publication Data
US 2005/0201146 A1    Sep. 15, 2005

Related U.S. Application Data

(62) Division of application No. 10/614,160, filed on Jul. 8, 2003, now Pat. No. 6,961,277.

(51) Int. Cl.
*G11C 11/00* (2006.01)
(52) U.S. Cl. ............. 365/222; 365/185.25; 365/185.18; 365/226
(58) Field of Classification Search ................ 365/222, 365/185.25, 185.18, 226
See application file for complete search history.

(56) References Cited

U.S. PATENT DOCUMENTS

| | | | |
|---|---|---|---|
| 3,271,591 A | 9/1966 | Ovshinsky |
| 3,622,319 A | 11/1971 | Sharp |
| 3,743,847 A | 7/1973 | Boland |

(Continued)

FOREIGN PATENT DOCUMENTS

JP    5-6126916    10/1981

(Continued)

OTHER PUBLICATIONS

Abdel-All, A.; Elshafie,A.; Elhawary, M.M., DC Electric-field Effect in Bulk and Thin-film Ge5As38Te57 Chalcogenide Glass, Vacuum 59 (2000) 845-853.

(Continued)

*Primary Examiner*—Viet Q. Nguyen
(74) *Attorney, Agent, or Firm*—Dickstein Shapiro LLP

(57) ABSTRACT

A method for refreshing PCRAM cells programmed to a low resistance state and entire arrays of PCRAM cells uses a simple refresh scheme which does not require separate control and application of discrete refresh voltages to the PCRAM cells in an array. Specifically, the array structure of a PCRAM device is constructed to allow leakage current to flow through each programmed cell in the array to refresh the programmed state. In one embodiment, the leakage current flows across the access device between the anode of the memory element and the bit line to which the cell is connected, for each memory cell in the array which has been programmed to the low resistance state. In another embodiment, the leakage current flows to the programmed cells through a doped substrate or doped regions of a substrate on which each cell is formed. An entire array is refreshed simultaneously by forming each memory element in the array to have one common anode formed as a single cell plate for the array. Only PCRAM cells in the array written to the low resistance state are refreshed by the controlled leakage current, whereas cells in the high resistance state are not affected by the refresh operation.

17 Claims, 6 Drawing Sheets

U.S. PATENT DOCUMENTS

| | | | |
|---|---|---|---|
| 3,961,314 A | 6/1976 | Klose et al. | |
| 3,966,317 A | 6/1976 | Wacks et al. | |
| 3,983,542 A | 9/1976 | Ovshinsky | |
| 3,988,720 A | 10/1976 | Ovshinsky | |
| 4,177,474 A | 12/1979 | Ovshinsky | |
| 4,267,261 A | 5/1981 | Hallman et al. | |
| 4,269,935 A | 5/1981 | Masters et al. | |
| 4,312,938 A | 1/1982 | Drexler et al. | |
| 4,316,946 A | 2/1982 | Masters et al. | |
| 4,320,191 A | 3/1982 | Yoshikawa et al. | |
| 4,405,710 A | 9/1983 | Balasubramanyam et al. | |
| 4,419,421 A | 12/1983 | Wichelhaus et al. | |
| 4,499,557 A | 2/1985 | Holmberg et al. | |
| 4,597,162 A | 7/1986 | Johnson et al. | |
| 4,608,296 A | 8/1986 | Keem et al. | |
| 4,637,895 A | 1/1987 | Ovshinsky et al. | |
| 4,646,266 A | 2/1987 | Ovshinsky et al. | |
| 4,664,939 A | 5/1987 | Ovshinsky | |
| 4,668,968 A | 5/1987 | Ovshinsky et al. | |
| 4,670,763 A | 6/1987 | Ovshinsky et al. | |
| 4,671,618 A | 6/1987 | Wu et al. | |
| 4,673,957 A | 6/1987 | Ovshinsky et al. | |
| 4,678,679 A | 7/1987 | Ovshinsky | |
| 4,696,758 A | 9/1987 | Ovshinsky et al. | |
| 4,698,234 A | 10/1987 | Ovshinsky et al. | |
| 4,710,899 A | 12/1987 | Young et al. | |
| 4,728,406 A | 3/1988 | Banerjee et al. | |
| 4,737,379 A | 4/1988 | Hudgens et al. | |
| 4,766,471 A | 8/1988 | Ovshinsky et al. | |
| 4,769,338 A | 9/1988 | Ovshinsky et al. | |
| 4,775,425 A | 10/1988 | Guha et al. | |
| 4,788,594 A | 11/1988 | Ovshinsky et al. | |
| 4,795,657 A | 1/1989 | Formigoni et al. | |
| 4,800,526 A | 1/1989 | Lewis | |
| 4,809,044 A | 2/1989 | Pryor et al. | |
| 4,818,717 A | 4/1989 | Johnson et al. | |
| 4,843,443 A | 6/1989 | Ovshinsky et al. | |
| 4,845,533 A | 7/1989 | Pryor et al. | |
| 4,847,674 A | 7/1989 | Sliwa et al. | |
| 4,853,785 A | 8/1989 | Ovshinsky et al. | |
| 4,891,330 A | 1/1990 | Guha et al. | |
| 5,128,099 A | 7/1992 | Strand et al. | |
| 5,159,661 A | 10/1992 | Ovshinsky et al. | |
| 5,166,758 A | 11/1992 | Ovshinsky et al. | |
| 5,177,567 A | 1/1993 | Klersy et al. | |
| 5,219,788 A | 6/1993 | Abernathey et al. | |
| 5,238,862 A | 8/1993 | Blalock et al. | |
| 5,272,359 A | 12/1993 | Nagasubramanian et al. | |
| 5,296,716 A | 3/1994 | Ovshinsky et al. | |
| 5,314,772 A | 5/1994 | Kozicki et al. | |
| 5,315,131 A | 5/1994 | Kishimoto et al. | |
| 5,335,219 A | 8/1994 | Ovshinsky et al. | |
| 5,341,328 A | 8/1994 | Ovshinsky et al. | |
| 5,350,484 A | 9/1994 | Gardner et al. | |
| 5,359,205 A | 10/1994 | Ovshinsky | |
| 5,359,554 A * | 10/1994 | Odake et al. | 365/184 |
| 5,360,981 A | 11/1994 | Owen et al. | |
| 5,406,509 A | 4/1995 | Ovshinsky et al. | |
| 5,414,271 A | 5/1995 | Ovshinsky et al. | |
| 5,500,532 A | 3/1996 | Kozicki et al. | |
| 5,512,328 A | 4/1996 | Yoshimura et al. | |
| 5,512,773 A | 4/1996 | Wolf et al. | |
| 5,534,711 A | 7/1996 | Ovshinsky et al. | |
| 5,534,712 A | 7/1996 | Ovshinsky et al. | |
| 5,536,947 A | 7/1996 | Klersy et al. | |
| 5,543,737 A | 8/1996 | Ovshinsky | |
| 5,591,501 A | 1/1997 | Ovshinsky et al. | |
| 5,596,522 A | 1/1997 | Ovshinsky et al. | |
| 5,687,112 A | 11/1997 | Ovshinsky | |
| 5,694,054 A | 12/1997 | Ovshinsky et al. | |
| 5,714,768 A | 2/1998 | Ovshinsky et al. | |
| 5,726,083 A | 3/1998 | Takaishi | |
| 5,751,012 A | 5/1998 | Wolstenholme et al. | |
| 5,761,115 A | 6/1998 | Kozicki et al. | |
| 5,789,277 A | 8/1998 | Zahorik et al. | |
| 5,814,527 A | 9/1998 | Wolstenholme et al. | |
| 5,818,749 A | 10/1998 | Harshfield | |
| 5,825,046 A | 10/1998 | Czubatyj et al. | |
| 5,841,150 A | 11/1998 | Gonzalez et al. | |
| 5,846,889 A | 12/1998 | Harbison et al. | |
| 5,851,882 A | 12/1998 | Harshfield | |
| 5,856,939 A * | 1/1999 | Seyyedy | 365/149 |
| 5,869,843 A | 2/1999 | Harshfield | |
| 5,886,932 A * | 3/1999 | Choi | 365/189.09 |
| 5,896,312 A | 4/1999 | Kozicki et al. | |
| 5,912,839 A | 6/1999 | Ovshinsky et al. | |
| 5,914,893 A | 6/1999 | Kozicki et al. | |
| 5,920,788 A | 7/1999 | Reinberg | |
| 5,933,365 A | 8/1999 | Klersy et al. | |
| 5,998,066 A | 12/1999 | Block et al. | |
| 6,011,757 A | 1/2000 | Ovshinsky | |
| 6,031,287 A | 2/2000 | Harshfield | |
| 6,072,716 A | 6/2000 | Jacobson et al. | |
| 6,077,729 A | 6/2000 | Harshfield | |
| 6,084,796 A | 7/2000 | Kozicki et al. | |
| 6,087,674 A | 7/2000 | Ovshinsky et al. | |
| 6,117,720 A | 9/2000 | Harshfield | |
| 6,141,241 A | 10/2000 | Ovshinsky et al. | |
| 6,143,604 A | 11/2000 | Chiang et al. | |
| 6,177,338 B1 | 1/2001 | Liaw et al. | |
| 6,236,059 B1 | 5/2001 | Wolstenholme et al. | |
| RE37,259 E | 7/2001 | Ovshinsky | |
| 6,297,170 B1 | 10/2001 | Gabriel et al. | |
| 6,300,684 B1 | 10/2001 | Gonzalez et al. | |
| 6,316,341 B1 * | 11/2001 | Lin | 438/546 |
| 6,316,784 B1 | 11/2001 | Zahorik et al. | |
| 6,329,606 B1 | 12/2001 | Freyman et al. | |
| 6,339,544 B1 | 1/2002 | Chiang et al. | |
| 6,348,365 B1 | 2/2002 | Moore et al. | |
| 6,350,679 B1 | 2/2002 | McDaniel et al. | |
| 6,376,284 B1 | 4/2002 | Gonzalez et al. | |
| 6,388,324 B2 | 5/2002 | Kozicki et al. | |
| 6,391,688 B1 | 5/2002 | Gonzalez et al. | |
| 6,404,665 B1 | 6/2002 | Lowery et al. | |
| 6,414,376 B1 | 7/2002 | Thakur et al. | |
| 6,418,049 B1 | 7/2002 | Kozicki et al. | |
| 6,420,725 B1 | 7/2002 | Harshfield | |
| 6,423,628 B1 | 7/2002 | Li et al. | |
| 6,426,908 B1 * | 7/2002 | Hidaka | 365/222 |
| 6,429,064 B1 | 8/2002 | Wicker | |
| 6,437,383 B1 | 8/2002 | Xu | |
| 6,440,837 B1 | 8/2002 | Harshfield | |
| 6,452,859 B1 * | 9/2002 | Shimano et al. | 365/230.06 |
| 6,462,984 B1 | 10/2002 | Xu et al. | |
| 6,469,364 B1 | 10/2002 | Kozicki | |
| 6,473,332 B1 | 10/2002 | Ignatiev et al. | |
| 6,480,438 B1 | 11/2002 | Park | |
| 6,487,106 B1 | 11/2002 | Kozicki | |
| 6,487,113 B1 | 11/2002 | Park et al. | |
| 6,501,111 B1 | 12/2002 | Lowery | |
| 6,507,061 B1 | 1/2003 | Hudgens et al. | |
| 6,511,862 B2 | 1/2003 | Hudgens et al. | |
| 6,511,867 B2 | 1/2003 | Lowery et al. | |
| 6,512,241 B1 | 1/2003 | Lai | |
| 6,514,805 B2 | 2/2003 | Xu et al. | |
| 6,531,373 B2 | 3/2003 | Gill et al. | |
| 6,534,781 B2 | 3/2003 | Dennison | |
| 6,545,287 B2 | 4/2003 | Chiang | |
| 6,545,907 B1 | 4/2003 | Lowery et al. | |
| 6,555,860 B2 | 4/2003 | Lowery et al. | |
| 6,560,155 B1 * | 5/2003 | Hush | 365/222 |
| 6,563,164 B2 | 5/2003 | Lowery et al. | |
| 6,566,700 B2 | 5/2003 | Xu | |
| 6,567,293 B1 | 5/2003 | Lowery et al. | |

| | | |
|---|---|---|
| 6,569,705 B2 | 5/2003 | Chiang et al. |
| 6,570,784 B2 | 5/2003 | Lowery |
| 6,576,921 B2 | 6/2003 | Lowery |
| 6,586,761 B2 | 7/2003 | Lowery |
| 6,589,714 B2 | 7/2003 | Maimon et al. |
| 6,590,807 B2 | 7/2003 | Lowery |
| 6,593,176 B2 | 7/2003 | Dennison |
| 6,597,009 B2 | 7/2003 | Wicker |
| 6,605,527 B2 | 8/2003 | Dennison et al. |
| 6,613,604 B2 | 9/2003 | Maimon et al. |
| 6,621,095 B2 | 9/2003 | Chiang et al. |
| 6,625,054 B2 | 9/2003 | Lowery et al. |
| 6,642,102 B2 | 11/2003 | Xu |
| 6,646,297 B2 | 11/2003 | Dennison |
| 6,649,928 B2 | 11/2003 | Dennison |
| 6,667,900 B2 | 12/2003 | Lowery et al. |
| 6,671,710 B2 | 12/2003 | Ovshinsky et al. |
| 6,673,648 B2 | 1/2004 | Lowery |
| 6,673,700 B2 | 1/2004 | Dennison et al. |
| 6,674,115 B2 | 1/2004 | Hudgens et al. |
| 6,687,153 B2 | 2/2004 | Lowery |
| 6,687,427 B2 | 2/2004 | Ramalingam et al. |
| 6,690,026 B2 | 2/2004 | Peterson |
| 6,696,355 B2 | 2/2004 | Dennison |
| 6,707,712 B2 | 3/2004 | Lowery |
| 6,714,954 B2 | 3/2004 | Ovshinsky et al. |
| 6,731,558 B2 * | 5/2004 | Yamauchi et al. .......... 365/222 |
| 6,888,769 B2 * | 5/2005 | Kirsch ........................ 365/205 |
| 6,891,749 B2 * | 5/2005 | Campbell et al. ........... 365/163 |
| 6,909,656 B2 * | 6/2005 | Moore et al. ................ 365/222 |
| 6,951,789 B2 * | 10/2005 | Voshell et al. .............. 438/241 |
| 6,961,277 B2 * | 11/2005 | Moore et al. ................ 365/222 |
| 7,023,751 B2 * | 4/2006 | Kirsch ........................ 365/205 |
| 7,139,208 B2 * | 11/2006 | Arimoto et al. ............. 365/222 |
| 7,145,795 B2 * | 12/2006 | Ghodsi ....................... 365/158 |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0132417 A1 | 9/2002 | Li |
| 2002/0160551 A1 | 10/2002 | Harshfield |
| 2002/0163828 A1 | 11/2002 | Krieger et al. |
| 2002/0168820 A1 | 11/2002 | Kozicki |
| 2002/0168852 A1 | 11/2002 | Kozicki |
| 2002/0181271 A1 * | 12/2002 | Sze ............................ 365/149 |
| 2002/0190289 A1 | 12/2002 | Harshfield et al. |
| 2002/0190350 A1 | 12/2002 | Kozicki et al. |
| 2003/0001229 A1 | 1/2003 | Moore et al. |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li et al. |
| 2003/0068862 A1 | 4/2003 | Li et al. |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155589 A1 | 8/2003 | Campbell et al. |
| 2003/0155606 A1 | 8/2003 | Campbell et al. |
| 2003/0156447 A1 | 8/2003 | Kozicki |
| 2003/0156463 A1 | 8/2003 | Casper et al. |
| 2003/0209728 A1 | 11/2003 | Kozicki et al. |
| 2003/0209971 A1 | 11/2003 | Kozicki et al. |
| 2003/0210564 A1 | 11/2003 | Kozicki et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |

FOREIGN PATENT DOCUMENTS

| | | |
|---|---|---|
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Adler, D.; Moss, S.C., Amorphous Memories and Bistable Switched, J. Vac. Sci. Technol. 9 (1972) 1182-1189.

Adler, D.; Henisch, H.K.; Mott, S.N., The Mechanism of Threshold Switching in Amorphous Alloya, Rev. Mod. Phys. 50 (1978) 209-220.

Afifi, M.A.; Labib, H.H.; El-Fazary, M.H.; Fadel, M., Electrical and Thermal Properties of Chalcogenide Glass System Se75Ge25-xSbx, Appl. Phys. A 55 (1992) 167-169.

Afifi, M.A.; Labib, H.H.; Fouad, S.S.; El-Shazly, A.A., Electrical & Thermal Conductivity of the Amorphous Semiconductor GexSe1-x, Egypt, J. Phys. 17 (1986) 335-342.

Alekperova, Sh.M.; Gadzhieva, G.S., Current-voltage Characteristics of Ag2Se Single Crystal Near the Phase Transition, Inorganic Materials 23 (1987) 137-139.

Aleksiejunas, A.; Cesnys, A., Switching Phenomenon and Memory Effect in Thin-film Heterojunction of Polycrystalline Selenium-silver Selenide, Phys. Stat. Sol. (a) 19 (1973) K169-K171.

Angell, C.A., Mobile Ions in Amorphous Solids, Annu. Rev. Phys. Chem. 43 (1992) 693-717.

Aniya, M., Average Electronegativity, Medium-range-order, and Ionic Conductivity in Superionic Glasses, Solid State Ionics 136-137 (2000) 1085-1089.

Asahara, Y.; Izumitani, T., Voltage Controlled Switching in Cu-As-Se Compositions, J. Non-Cryst. Solids 11 (1972) 97-104.

Asokan, S.; Prasad, M.V.N.; Parthasarathy, G.; Gopal, E.S.R., Mechanical and Chemical Thresholds in IV-VI Chalcogenide Glasses, Phys. Rev. Lett. 62 (1989) 808-810.

Axon Technologies Corporation, Technology Description: *Programmable Metalization Cell (PMC)*, pp. 1-6 (pre-May 2000).

Baranovskii, S.D.; Cordes, H., On the Conduction Mechanism in Ionic Glasses, J. Chem. Phys. 111 (1999) 7546-7557.

Belin, R.; Taillades, G.; Pradel, A.; Ribes, M., Ion Dynamics in Superionic Chalcogenide Glasses: CompleteConductivity Spectra, Solid State Ionics 136-137 (2000) 1025-1029.

Belin, R.; Zerouale, A.; Pradel, A.; Ribes, M., Ion Dynamics in the Argyrodite Compound Ag7GeSe5I: Non-Arrhenius Behavior and Complete Conductivity Spectra, Solid State Ionics 143 (2001) 445-455.

Benmore, C.J.; Salmon, P.S., Structure of Fast Ion Conducting and Semiconducting Glassy Chalcogenide Alloys, Phys. Rev. Lett. 73 (1994) 264-267.

Bernede, J.C., Influence Du Metal Des Electrodes Sur Les Caracteristiques Courant-tension Des Structures M-Ag2Se-M, Thin Solid Films 70 (1980) L1-L4.

Bernede, J.C., Polarized Memory Switching in MIS Thin Films, Thin Solid Films 81 (1981) 155-160.

Bernede, J.C., Switching and Silver Movements in Ag2Se Thin Films, Phys. Stat. Sol. (a) 57 (1980) K101-K104.

Bernede, J.C.; Abachi, T., Differential Negative Resistance in Metal/insulator/metal Structures with an Upper Bilayer Electrode, Thin Solid Films 131 (1985) L61-L64.

Bernede, J.C.; Conan, A.; Fousenan't, E.; El Bouchairi, B.; Goureaux, G., Polarized Memory Switching Effects in Ag2Se/Se/M Thin Film Sandwiches, Thin Solid Films 97 (1982) 165-171.

Bernede, J.C.; Khelil, A.; Kettaf, M.; Conan, A., Transition from S- to N-type Differential Negative Resistance in Al-Al2O3-Ag2-xSe1+x Thin Film Structures, Phys. Stat. Sol. (a) 74 (1982) 217-224.

Bondarev, V.N.; Pikhitsa, P.V., A Dendrite Model of Current Instability in RbAg4I5, Solid State Ionics 70/71 (1994) 72-76.

Boolchand, P., The Maximum in Glass Transition Temperature (Tg) Near $x=1/3$ in GexSe1-x Glasses, Asian Journal of Physics (2000) 9, 709-72.

Boolchand, P.; Bresser, W.J., Mobile Silver Ions and Glass Formation in Solid Electrolytes, Nature 410 (2001) 1070-1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of Rigidity in Steps in Chalcogenide Glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural Ordering of Evaporated Amorphous Chalcogenide Alloy Ffilms: Role of Thermal Annealing, Diffusion and Defect Data vol. 53-54 (1987) 415-420.

Boolchand, P.; Grothaus, J.; Bresser, W.J.; Suranyi, P., Structural Origin of Broken Chemical Order in a GeSe2 glass, Phys. Rev. B 25 (1982) 2975-2978.

Boolchand, P.; Grothaus, J.; Phillips, J.C., Broken Chemical Order and Phase Separation in GexSe1-x Glasses, Solid State Comm. 45 (1983) 183-185.

Boolchand, P., Bresser, W.J., Compositional Trends in Glass Transition Temperature (Tg), Network Connectivity and Nanoscale Chemical Phase Separation in Chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 Glasses Compared, Proc. Int. Conf. Phys. Semicond. (Eds. Chadi and Harrison) $17^{th}$ (1985) 833-36.

Bresser, W.; Boolchand, P.; Suranyi, P., Rigidity Percolation and Molecular Clustering in Network Glasses, Phys. Rev. Lett. 56 (1986) 2493-2496.

Bresser, W.J.; Boolchand, P.; Suranyi, P.; de Neufville, J.P, Intrinsically Broken Chalcogen Chemical Order in Stoichiometric Glasses, Journal de Physique 42 (1981) C4-193-C4-196.

Bresser, W.J.; Boolchand, P.; Suranyi, P.; Hernandez, J.G., Molecular Phase Separation and Cluster Size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-temperature, Electric Field Induced Creation of Stable Devices in CuInSe2 Crystals, Science 258 (1992) 271-274.

Chatterjee, R.; Asokan, S.; Titus, S.S.K., Current-controlled Negative-resistance Behavior and Memory Switching in Bulk As-Te-Se Glasses, J. Phys. D: Appl. Phys. 27 (1994) 2624-2627.

Chen, C.H.; Tai, K.L. , Whisker Growth Induced by Ag Photodoping in Glassy GexSe1-x Films, Appl. Phys. Lett. 37 (1980) 1075-1077.

Chen, G.; Cheng, J., Role of Nitrogen in the Crystallization of Silicon Nitride-doped Chalcogenide Glasses, J. Am. Ceram. Soc. 82 (1999) 2934-2936.

Chen, G.; Cheng, J.; Chen, W., Effect of Si3N4 on Chemical Durability of Chalcogenide Glass, J. Non-Cryst. Solids 220 (1997) 249-253.

Cohen, M.H.; Neale, R.G.; Paskin, A., A Model for an Amorphous Semiconductor Memory Device, J. Non-Cryst. Solids 8-10 (1972) 885-891.

Croitoru, N.; Lazarescu, M.; Popescu, C.; Telnic, M.; and Vescan, L., Ohmic and Non-ohmic Conduction in Some Amorphous Semiconductors, J. Non-Cryst. Solids 8-10 (1972) 781-786.

Dalven, R.; Gill, R., Electrical Properties of Beta-Ag2Te and Beta-Ag2Se From 4.2° to 300° K, J. Appl. Phys. 38 (1967) 753-756.

Davis, E.A., Semiconductors Without Form, Search 1 (1970) 152-155.

Dearnaley, G.; Stoneham, A.M.; Morgan, D.V., Electrical Phenomena in Amorphous Oxide Films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold Switching in Hydrogenated Amorphous Silicon, Appl. Phys. Lett. 40 (1982) 812-813.

Drusedau, T.P.; Panckow, A.N.; Klabunde, F., The Hydrogenated Amorphous Silicon/nanodisperse Metal (SIMAL) System-Films of Unique Electronic Properties, J. Non-Cryst. Solids 198-200 (1996) 829-832.

El Bouchairi, B.; Bernede, J.C.; Burgaud, P., Properties of Ag2-xSe1+x/n-Si Diodes, Thin Solid Films 110 (1983) 107-113.

El Gharras, Z.; Bourahla, A.; Vautier, C., Role of Photoinduced Defects in Amorphous GexSe1-x Photoconductivity, J. Non-Cryst. Solids 155 (1993) 171-179.

El Ghrandi, R.; Calas, J.; Galibert, G.; Averous, M., Silver Photodissolution in Amorphous Chalcogenide Tthin Films, Thin Solid Films 218 (1992) 259-273.

El Ghrandi, R.; Calas, J.; Galibert, G., Ag Dissolution Kinetics in Amorphous GeSe5.5 Thin Films from "In-situ " Resistance Measurements vs. Time, Phys. Stat. Sol. (a) 123 (1991) 451-460.

El-kady, Y.L., The Threshold Switching in Semiconducting Glass Ge21Se17Te62, Indian J. Phys. 70A (1996) 507-516.

Elliott, S.R., A Unified Mechanism for Metal Photodissolution in Amorphous Chalcogenide Materials, J. Non-Cryst. Solids 130 (1991) 85-97.

Elliott, S.R., Photodissolution of Metals in Chalcogenide Glasses: A Unified Mechanism, J. Non-Cryst. Solids 137-138 (1991) 1031-1034.

Elsamanoudy, M.M.; Hegab, N.A.; Fadel, M., Conduction Mechanism in the Pre-switching State of Thin Films Containing Te As Ge Si, Vacuum 46 (1995) 701-707.

El-Zahed, H.; El-Korashy, A., Influence of Composition on the Electrical and Optical Properties of Ge20BixSe80-x Films, Thin Solid Films 376 (2000) 236-240.

Fadel, M., Switching Phenomenon in Evaporated Se-Ge-As Thin Films of Amorphous Chalcogenide Glass, Vacuum 44 (1993) 851-855.

Fadel, M.; El-Shair, H.T., Electrical, Thermal and Optical Properties of Se75Ge7Sb18, Vacuum 43 (1992) 253-257.

Feng, X. Bresser, W.J.; Boolchand, P., Direct Evidence for Stiffness Threshold in Chalcogenide Glasses, Phys. Rev. Lett. 78 (1997) 4422-4425.

Feng, X. Bresser, W.J.; Zhang, M.; Goodman, B.; Boolchand, P., Role of Network Connectivity on the Elastic, Plastic and Thermal Behavior of Covalent Glasses, J. Non-Cryst. Solids 222 (1997) 137-143.

Fischer-Colbire, A.; Bienenstock, A.; Fuoss, P.H.; Marcus, M.A., Structure and Bonding in Photodiffused Amorphous Ag-GeSe2 Thin Films, Phys. Rev. B 38 (1988) 12388-12403.

Fleury, G.; Hamou, A.; Viger, C.; Vautier, C., Conductivity and Crystallization of Amorphous Selenium, Phys. Stat. Sol. (a) 64 (1981) 311-316.

Fritzsche, H, Optical and Electrical Energy Gaps in Amorphous Semiconductors, J. Non-Cryst. Solids 6 (1971) 49-71.

Fritzsche, H., Electronic Phenomena in Amorphous Semiconductors, Annual Review of Materials Science 2 (1972) 697-744.

Gates, B.; Wu, Y.; Yin, Y.; Yang, P.; Xia, Y., Single-crystalline Nanowires of Ag2Se can be Synthesized by Templating Against Nanowires of Ttrigonal Se, J. Am. Chem. Soc. (2001) currently ASAP.

Gosain, D.P.; Nakamura, M.; Shimizu, T.; Suzuki, M.; Okano, S., Nonvolatile Memory Based on Reversible Phase Transition Phenomena in Telluride Glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation Creep of Ge-Se Chalcogenide Glasses Below Tg: Elastic Recovery and Non-Newtonian Flow, J, Non-Cryst. Solids 298 (2002) 260-269.

Guin, J.-P.; Rouxel, T.; Sangleboeuf, J.-C; Melscoet, I.; Lucas, J., Hardness, Toughness, and Scratchability of Germanium-selenium Chalcogenide Glasses, J. Am. Ceram. Soc. 85 (2002) 1545-52.

Gupta, Y.P., On Electrical Switching and Memory Effects in Amorphous Chalcogenides, J. Non-Cryst. Sol. 3 (1970) 148-154.

Haberland, D.R.; Stiegler, H., New Experiments on the Charge-controlled Switching Effect in Amorphous Semiconductors, J. Non-Cryst. Solids 8-10 (1972) 408-414.

Haifz, M.M.; Ibrahim, M.M.; Dongol, M.; Hammad, F.H., Effect of Composition on the Structure and Electrical Properties of As-Se-Cu Glasses, J. Apply. Phys. 54 (1983) 1950-1954.

Hajto, J.; Rose, M.J.; Osborne, I.S.; Snell, A.J.; Le Comber, P.G.; Owen, A.E., Quantization Effects in Metal/a-Si:H/metal Devices, Int. J. Electronics 73 (1992) 911-913.

Hajto, J.; Hu, J.; Snell, A.J.; Turvey, K.; Rose, M., DC and AC Measurements on Metal/a-Si:H/metal Room Temperature Quantised Resistance Devices, J. Non-Cryst. Solids 266-269 (2000) 1058-1061.

Hajto, J.; McAuley, B.; Snell, A.J.; Owen, A.E., Theory of Room Temperature Quantized Resistance Effects in Metal-a-Si:H-metal Thin Film Structures, J. Non-Cryst. Solids 198-200 (1996) 825-828.

Hajto, J.; Owen, A.E.; Snell, A.J.; Le Comber, P.G.; Rose, M.J., Analogue Memory and Ballistic Electron Effects in Metal-amorphous Silicon Structures, Phil. Mag. B 63 (1991) 349-369.

Hayashi, T.; Ono, Y.; Fukaya, M.; Kan, H., Polarized Memory Switching in Amorphous Se Film, Japan. J. Appl. Phys. 13 (1974) 1163-1164.

Hegab, N.A.; Fadel, M.; Sedeek, K., Memory Switching Phenomena in Thin Films of Chalcogenide Semiconductors, Vacuum 45 (1994) 459-462.

Helbert et al., *Intralevel Hybrid Resist Process with Submicron Capability*, SPIE vol. 333 Submicron Lithography, pp. 24-29 (1982).

Hilt, Dissertation: *Materials Characterization of Silver Chalcogenide Programmable Metalization Cells*, Arizona State University, pp. Title p. 114 (UMI Company, May 1999).

Hirose et al., *High Speed Memory Behavior and Reliability of an Amorphous $As_2S_3$ Film Doped with Ag*, Phys. Stat. Sol. (a) 61, pp. 87-90 (1980).

Hirose, Y.; Hirose, H., Polarity-dependent Memory Switching and Behavior of Ag Dendrite in Ag-photodoped Amorphous As2S3 Films, J. Appl. Phys. 47 (1976) 2767-2772.

Holmquist et al., *Reaction and Diffusion in Silver-Arsenic Chalcogenide Glass Systems*, 62 J. Amer. Ceram. Soc., No. 3-4, pp. 183-188 (Mar.-Apr. 1979).

Hong, K.S.; Speyer, R.F., Switching Behavior in II-IV-V2 Amorphous Semiconductor Systems, J. Non-Cryst. Solids 116 (1990) 191-200.

Hosokawa, S., Atomic and Electronic Structures of Glassy $Ge_xSe_{1-x}$ Around the Stiffness Threshold Composition, J. Optoelectronics and Advanced Materials 3 (2001) 199-214.

Hu, J.; Snell, A.J.; Hajto, J.; Owen, A.E., Constant Current Forming in Cr/p+a-Si:H/V Thin Film Devices, J. Non-Cryst. Solids 227-230 (1998) 1187-1191.

Hu, J.; Hajto, J.; Snell, A.J.; Owen, A.E.; Rose, M.J., Capacitance Anomaly Near the Metal-Non-metal Transition in Cr-hydrogenated Amorphous Si-V Thin-film Devices, Phil. Mag. B 74 (1996) 37-50.

Hu, J.; Snell, A.J.; Hajto, J.; Owen, A.E., Current-induced Instability in Cr-p+a-Si:H-V Thin Film Devices, Phil. Mag. B 80 (2000) 29-43.

Huggett et al., Development of Silver Sensitized Germanium Selenide Photoresist by Reactive Sputter Etching in SF6, 42 Appl. Phys. Lett., No. 7, pp. 592-594 (Apr. 1983).

Iizima, S.; Sugi, M.; Kikuchi, M.; Tanaka, K., Electrical and Thermal Properties of Semiconducting Glasses As-Te-Ge, Solid State Comm. 8 (1970) 153-155.

Ishikawa, R.; Kikuchi, M., Photovoltaic Study on the Photo-enhanced Diffusion of Ag in Amorphous Films of Ge2S3, J. Non-Cryst. Solids 35 & 36 (1980) 1061-1066.

Iyetomi, H.; Vashishta, P.; Kalia, R.K., Incipient Phase Separation in Ag/Ge/Se Glasses: Clustering of Ag Atoms, J. Non-Cryst. Solids 262 (2000) 135-142.

Jones, G.; Collins, R.A., Switching Properties of Thin Selenium Films Under Pulsed Bias, Thin Solid Films 40 (1977) L15-L18.

Joullie, A.M.; Marucchi, J., On the DC Electrical Conduction of Amorphous As2Se7 Before Switching, Phys. Stat. Sol. (a) 13 (1972) K105-K109.

Joullie, A.M.; Marucchi, J., Electrical Properties of the Amorphous Alloy As2Se5, Mat. Res. Bull. 8 (1973) 433-441.

Kaplan, T.; Adler, D., Electrothermal Switching in Amorphous Semiconductors, J. Non-Cryst. Solids 8-10 (1972) 538-543.

Kawaguchi et al., *Mechanism of Photosurface Deposition*, 164-166 J. Non-Cryst. Solids, pp. 1231-1234 (1993).

Kawaguchi, T.; Maruno, S.; Elliott, S.R., Optical, Electrical, and Structure Properties of Amorphous Ag-Ge-S and Ag-Ge-Se Films and Comparison of Photoinduced and Thermally Induced Phenomena of Both Systems, J. Appl. Phys. 79 (1996) 9096-9104.

Kawaguchi, T.; Masui, K., Analysis of Change in Optical Ttransmission Spectra Resulting from Ag Photodoping in Chalcogenide Film, Japn. J. Appl. Phys. 26 (1987) 15-21.

Kawamoto, Y., Nishida, M., Ionic Condition in As2S3—Ag2S, GeS2—GeS—Ag2S and P2S5-Ag2S Glasses, J. Non-Cryst Solids 20 (1976) 393-404.

Kawasaki, M.; Kawamura, J.; Nakamura, Y.; Aniya, M., Ionic Conductivity of $Ag_x(GeSe_3)_{1-x}$ ($0<=x<=0.571$) Glasses, Solid State Ionics 123 (1999) 259-269.

Kluge, G.; Thomas, A.; Klabes, R.; Grotzschel, R., Suptitz, P. Silver Photodiffusion in Amorphous $Ge_xSe_{100-x}$, J. Non-Cryst. Solids 124 (1990) 186-193.

Kolobov, A.V., On the Origin of P-type Conductivity in Amorphous Chalcogenides, J. Non-Cryst. Solids 198-200 (1996) 728-731.

Kolobov, A.V., Lateral Diffusion of Silver in Vitreous Chalcogenide Films, J. Non-Cryst. Solids 137-138 (1991) 1027-1030.

Kolobov et al., Photodoping of Amorphous Chalcogenides by Metals, Advances in Physics, 1991, vol. 40, No. 5, pp. 625-684.

Korkinova, Ts.N.; Andreichin, R.E., Chalcogenide Glass Polarization and the Type of Contacts, J. Non-Cryst. Solids 194 (1996) 256-259.

Kotkata, M.F.; Afifi M.A.; Labib, H.H.; Hegab, N.A.; Abdel-Aziz, M.M., Memory Switching in Amorphous GeSeTI Chalcogenide Semiconductor Films, Thin Solid Films 240 (1994) 143-146.

Kozicki et al., Silver Incorporation in Thin Films of Selenium Rich Ge-Se Glasses, International Congress on Glass, vol. 2, Extended Abstracts, Jul. 2001, pp. 8-9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes In Metal-doped Chalcogenides, Electrochemical Society Proceedings, vol. 99-13, 1999, pp. 298-309.

Kozicki et al., Nanoscale Effects in Devices Based on Chalcogenide Solid Solutions, Superlattices and Microstructures, vol. 27, No. 5/6, 2000, pp. 485-488.

Kozicki et al., Nanoscale Phase Separation in Ag-Ge-Se Glasses, Microelectronic Engineering 63 (2002) pp. 155-159.

Lakshminarayan, K.N.; Srivastava, K.K.; Panwar, O.S.; Kumar, A., Amorphous Semiconductor Devices: Memory and Switching Mechanism, J. Instn Electronics & Telecom. Engrs 27 (1981) 16-19.

Lal, M.; Goyal, N., Chemical Bond Approach to Study the Memory and Threshold Switching Chalcogenide Glasses, Indian Journal of Pure & Appl. Phys. 29 (1991) 303-304.

Leimer, F.; Stotzel, H.; Kottwitz, A., Isothermal Electrical Polarisation of Amorphous GeSe Films with Blocking Al Contacts Influences by Poole-Frenkel Conduction, Phys. Stat. Sol. (a) 29 (1975) K129-K132.

Leung, W.; Cheung, N.; Neureuther, A.R., Photoinduced Diffusion of Ag in $Ge_xSe_{1-x}$ Glass, Appl. Phys. Lett. 46 (1985) 543-545.

Matsushita, T.; Yamagami, T.; Okuda, M., Polarized Memory Effect Observed on Se-SnO2 System, Jap. J. Appl. Phys. 11 (1972) 1657-1662.

Matsushita, T.; Yamagami, T.; Okuda, M., Polarized Memory Effect Observed on Amorphous Selenium Thin Films, Jpn. J. Appl. Phys. 11 (1972) 606.

Mazurier, F.; Levy, M.; Souquet, J.L, Reversible and Irreversible Electrical Switching in TeO2-V2O5 Based Glasses, Journal de Physique IV 2 (1992) C2-185-C2-188.

McHardy et al., The Dissolution of Metals in Amorphous Chalcogenides and the Effects of Electron and Ultraviolet Radiation, 20 J. Phys. C.: Solid State Phys., pp. 4055-4075 (1987).

Messoussi, R.; Bernede, J.C.; Benhida, S.; Abachi, T.; Latef, A., Electrical Characterization of M/Se Structures (M=Ni,Bi), Mat. Chem. And Phys. 28 (1991) 253-258.

Mitkova, M.; Boolchand, P., Microscopic Origin of the Glass Forming Tendency in Chalcohalides and Constraint Theory, J. Non-Cryst. Solids 240 (1998) 1-21.

Mitkova, M.; Kozicki, M.N., Silver Incorporation in Ge-Se Glasses Used in Programmable Metallization Cell Devices, J. Non-Cryst. Solids 299-302 (2002) 1023-1027.

Mitkova, M.; Wang, Y.; Boolchand, P., Dual Chemical Role of Ag as an Additive in Chalcogenide Glasses, Phys. Rev. Lett. 83 (1999) 3848-3852.

Miyatani, S.-y., Electronic and Ionic Conduction in $(Ag_xCu_{1-x})2Se$, J. Phys. Soc. Japan 34 (1973) 423-432.

Miyatani, S.-y., Electrical Properties of Ag2Se, J. Phys. Soc. Japan 13 (1958) 317.

Miyatani, S.-y., Ionic Conduction in Beta-Ag2Te and Beta-Ag2Se, Journal Phys. Soc. Japan 14 (1959) 996-1002.

Mott, N.F., Conduction in Glasses Containing Transition Metal Ions, J. Non-Cryst. Solids 1 (1968) 1-17.

Nakayama, K.; Kitagawa, T.; Ohmura, M.; Suzuki, M., Nonvolatile Memory Based on Phase Transition in Chalcogenide Thin Films, Jpn. J. Appl. Phys. 32 (1993) 564-569.

Nakayama, K.; Kojima, K.; Hayakawa, F.; Imai, Y.; Kitagawa, A.; Suzuki, M., Submicron Nonvolatile Memory Cell Based on Reversible Phase Transition in Chalcogenide Glasses, Jpn. J. Appl. Phys. 39 (2000) 6157-6161.

Nang, T.T.; Okuda, M.; Matsushita, T.; Yokota, S.; Suzuki, A., Electrical and Optical Properties of $Ge_xSe_{1-x}$ Amorphous Thin Films, Jap. J. App. Phys. 15 (1976) 849-853.

Narayana, R.A.; Asokan, S.; Kumar, A., Evidence Concerning the Effect of Topology on Electrical Switching in Chalcogenide Network Glasses, Phys. Rev. B 54 (1996) 4413-4415.

Neale, R.G.; Aseltine, J.A., The Application of Amorphous Materials to Computer Memories, IEEE Transactions on Electron Dev. Ed-20 (1973) 195-209.

Ovshinsky S.R.; Fritzsche, H., Reversible Structural Transformations in Amorphous Semiconductors for Memory and Logic, Metalurgical Transactions 2 (1971) 641-645.

Ovshinsky, S.R., Reversible Electrical Switching Phenomena in Disordered Structures, Phys. Rev. Lett. 21 (1968) 1450-1453.

Owen, A.E.; LeComber, P.G.; Sarrabayrouse, G.; Spear, W.E., New Amorphous-silicon Electrically Programmable Nonvolatile Switching Device, IEE Proc. 129 (1982) 51-54.

Owen, A.E.; Firth, A.P.; Ewen, P.J.S., Photo-induced Structural and Physico-chemical Changes in Amorphous Chalcogenide Semiconductors, Phil. Mag. B 52 (1985) 347-362.

Owen, A.E.; Le Comber, P.G.; Hajto, J.; Rose, M.J.; Snell, A.J., Switching in Amorphous Devices, Int. J. Electronics 73 (1992) 897-906.

Owen et al., Metal-Chalcogenide Photoresists for High Resolution Lithography and Sub-Micron Structures, Nanostructure Physics and Fabrication, pp. 447-451 (M. Reed ed. 1989).

Pattanayak, P.; Asokan, S., Signature of a Silver Phase Percolation Threshold in Microscopically Phase Separated Ternary $Ge_{0.15}Se_{0.84-x}Ag_x$ ($0 \leq x \leq 0.20$) Glasses, J. App. Phys. 97 (published online Dec. 13, 2004).

Pearson, A.D.; Miller, C.E., Filamentary Conduction in Semiconducting Glass Diodes, App. Phys. Lett. 14 (1969) 280-282.

Pinto, R.; Ramanathan, K.V., Electric Field Induced Memory Switching in Thin Films of the Chalcogenide System Ge-As-Se, Appl. Phys. Lett. 19 (1971) 221-223.

Popescu, C., The Effect of Local Non-uniformities on Thermal Switching and High Field Behavior of Structures with Chalcogenide Glasses, Solid-State Electronics 18 (1975) 671-681.

Popescu, C.; Croitoru, N., The Contribution of the Lateral Thermal Instability to the Switching Phenomenon, J. Non-Cryst. Solids 8-10 (1972) 531-537.

Popov, A.I.; Geller, I.KH.; Shemetova, V.K., Memory and Threshold Switching Effects in Amorphous Selenium, Phys. Stat. Sol. (a) 44 (1977) K71-K73.

Prakash, S.; Asokan, S.; Ghare, D.B., Easily Reversible Memory Switching in Ge-As-Te Glasses, J. Phys. D: Appl. Phys. 29 (1996) 2004-2008.

Rahman, S.; Sivarama Sastry, G., Electronic Switching in Ge-Bi-Se-Te Glasses, Mat. Sci. and Eng. B12 (1992) 219-222.

Ramesh, K.; Asokan, S.; Sangunni, K.S.; Gopal, E.S.R., Electrical Switching in Germanium Telluride Glasses Doped with Cu and Ag, Appl. Phys. A 69 (1999) 421-425.

Rose,M.J.;Hajto,J.;Lecomber,P.G.;Gage,S.M.;Choi,W.K.;Snell,A.J.;Owen,A.E., Amorphous Silicon Analogue Memory Devices, J. Non-Cryst. Solids 115 (1989) 168-170.

Rose,M.J.;Snell,A.J.;Lecomber,P.G.;Hajto,J.;Fitzgerald,A.G.;Owen,A.E., Aspects of Non-volatility in a -Si:H Memory Devices, Mat. Res. Soc. Symp. Proc. V 258, 1992, 1075-1080.

Schuocker, D.; Rieder, G., On the Reliability of Amorphous Chalcogenide Switching Devices, J. Non-Cryst. Solids 29 (1978) 397-407.

Sharma, A.K.; Singh, B., Electrical Conductivity Measurements of Evaporated Selenium Films in Vacuum, Proc. Indian Natn. Sci. Acad. 46, A, (1980) 362-368.

Sharma, R. P., Structural, Electrical and Optical Properties of Silver Selenide Films, Ind. J. Of Pure and Applied Phys. 35 (1997) 424-427.

Shimizu et al., *The Photo-Erasable Memory Switching Effect of Ag Photo-Doped Chalcogenide Glasses*, 46 B. Chem Soc. Japan, No. 12, pp. 3662-3665 (1973).

Snell, A.J.; Lecomber, P.G.; Hajto, J.; Rose, M.J.; Owen, A.E.; Osborne, I.S., Analogue Memory Effects in Metal/a-Si:H/metal Memory Devices, J. Non-Cryst. Solids 137-138 (1991) 1257-1262.

Snell, A.J.; Hajto, J.;Rose, M.J.; Osborne, I.S.; Holmes, A.; Owen, A.E.; Gibson, R.A.G., Analogue Memory Effects in Metal/a-Si:H/metal Thin Film Structures, Mat. Res. Soc. Symp. Proc. V 297, 1993, 1017-1021.

Steventon, A.G., Microfilaments in Amorphous Chalcogenide Memory Devices, J. Phys. D: Appl. Phys. 8 (1975) L120-L122.

Steventon, A.G., The Switching Mechanisms in Amorphous Chalcogenide Memory Devices, J. Non-Cryst. Solids 21 (1976) 319-329.

Stocker, H.J., Bulk and Thin Film Switching and Memory Effects in Semiconducting Chalcogenide Glasses, App. Phys. Lett. 15 (1969) 55-57.

Tanaka, K., Ionic and Mixed Conductions in Ag Photodoping Process, Mod. Phys. Lett B 4 (1990) 1373-1377.

Tanaka, K.; Iizima, S.; Sugi, M.; Okada, Y.; Kikuchi, M., Thermal Effect on Switching Phenomenon in Chalcogenide Amorphous Semiconductors, Solid State Comm. 8 (1970) 387-389.

Thornburg, D.D., Memory Switching in a Type I Amorphous Chalcogenide, J. Elect. Mat. 2 (1973) 3-15.

Thornburg, D.D., Memory Switching in Amorphous Arsenic Triselenide, J. Non-Cryst. Solids 11 (1972) 113-120.

Thornburg, D.D.; White, R.M., Electric Field Enhanced Phase Separation and Memory Switching in Amorphous Arsenic Triselenide, Journal (1972) 4609-4612.

Tichy, L.; Ticha, H., Remark on the Glass-forming Ability in $Ge_xSe_{1-x}$ and $As_xSe_{1-x}$ Systems, J. Non-Cryst. Solids 261 (2000) 277-281.

Titus, S.S.K.; Chatterjee, R.; Asokan, S., Electrical Switching and Short-range Order in As-Te Glasses, Phys. Rev. B 48 (1993) 14650-14652.

Tranchant,S.;Peytavin,S.;Ribes,M.;Flank,A.M.;Dexpert,H.;Lagarde,J.P., Silver Chalcogenide Glasses Ag-Ge-Se: Ionic Conduction and Exafs Structural Investigation, Transport-structure Relations in Fast Ion and Mixed Conductors Proceedings of the 6th Riso International Symposium. Sep. 9-13, 1985, pp. 425-430.

Tregouet, Y.; Bernede, J.C., Silver Movements in Ag2Te Thin Films: Switching and Memory effects, Thin Solid Films 57 (1979) 49-54.

Uemura, O.; Kameda, Y.; Kokai, S.; Satow, T., Thermally Induced Crystallization of Amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric Field Induced Filament Formation in As-Te-Ge Glass, J. Non-Cryst. Solids 2 (1970) 358-370.

Viger, C.; Lefrancois, G.; Fleury, G., Anomalous Behaviour of Amorphous Selenium Films, J. Non-Cryst. Solids 33 (1996) 267-272.

Vodenicharov, C.; Parvanov,S.; Petkov,P., Electrode-limited Currents in the Thin-film M-GeSe-M System, Mat. Chem. And Phys. 21 (1989) 447-454.

Wang, S.-J.; Misium, G.R.; Camp, J.C.; Chen, K.-L.; Tigelaar, H.L., High-performance Metal/silicide Antifuse, IEEE Electron Dev. Lett. 13 (1992) 471-472.

Weirauch, D.F., Threshold Switching and Thermal Filaments in Amorphous Semiconductors, App. Phys. Lett. 16 (1970) 72-73.

West, W.C.; Sieradzki, K.; Kardynal, B.; Kozicki, M.N., Equivalent Circuit Modeling of the Ag|As0.24S0.36Ag0.40|Ag System Prepared by Photodissolution of Ag, J. Electrochem. Soc. 145 (1998) 2971-2974.

West, W.C., Electrically Erasable Non-volatile Memory Via Electrochemical Deposition of Multifractal Aggregates, Ph.D. Dissertation, ASU 1998, 189 pages.

Zhang, M.; Mancini, S.; Bresser, W.; Boolchand, P., Variation of Glass Transition Temperature, Tg, with Average Coordination Number, <m>, in Network Glasses: Evidence of a Threshold Behavior in the Slope |dTg/d<m>| at the Rigidity Percolation Threshold (<m>=2.4), J. Non-Cryst. Solids 151 (1992) 149-154.

* cited by examiner

METHOD OF REFRESHING A PCRAM MEMORY DEVICE

This application is a divisional of U.S. patent application Ser. No. 10/614,160, filed Jul. 8, 2003, now U.S. Pat No. 6,961,277 the entirety of which is hereby incorporated by reference.

FIELD OF THE INVENTION

The invention relates generally to the field of semiconductor devices and, more particularly, to programmable conductor random access memory (PCRAM) devices.

BACKGROUND OF THE INVENTION

Microprocessor-controlled integrated circuits are used in a wide variety of applications. Such applications include, for example, personal computers, vehicle control systems, telephone networks, and a host of consumer products. As is well known, microprocessors are essentially generic devices that perform specific functions under the control of a software program. This program is stored in one or more memory devices that are coupled to the microprocessor. Not only does the microprocessor access memory devices to retrieve the program instructions, but it also stores and retrieves data created during execution of the program in one or more memory devices.

There are a variety of different memory devices available for use in microprocessor-based systems. The type of memory device chosen for a specific function within a microprocessor-based system depends largely upon what features of the memory are best suited to perform the particular function. For instance, random access memories such as dynamic random access memories (DRAMs) and static random access memories (SRAMs) are used to temporarily store program information and data "actively" being used by the microprocessor. The data stored in random access memories may be read, erased, and rewritten many times during the execution of a program or function. Read only memories (ROMs), "write once read many" devices (WORMs) and electrically erasable programmable read only memories (EEPROMs), and flash memories on the other hand, are used as long term memory devices which permanently store information about the microprocesor system or store software programs or instructions for performing specific functions until erased or deleted by a user, for example.

Random access memories tend to provide greater storage capability and programming options and cycles than read only memories, but they must be continually powered in order to retain their content. Most random access memories store data in the form of charged and discharged capacitors contained in an array of memory cells. Such memory cells, however, are volatile in that the stored charges will dissipate after a relatively short period of time because of the natural tendency of an electrical charge to distribute itself into a lower energy state. For this reason, most random access memories such as DRAMs must be refreshed, that is, the stored value must be rewritten to the cells, about every 100 milliseconds in order to retain the stored data in the memory cells. Even SRAMs, which do not require refreshing, will only retain stored data as long as power is supplied to the memory device. When the power supply to the memory device is turned off, the data is lost.

Read only memories presently used in microprocessor devices are non-volatile, that is, capable of retaining stored information even when power to the memory device is turned off. Some read only memory devices are constructed so that once programmed with data, they cannot be reprogrammed. The read only memories that can be reprogrammed have complex structures which are difficult to manufacture, occupy a large amount of space and consume large quantities of power. For these reasons, read only memories are unsuitable for use in portable devices and/or as substitutes for the frequently accessed random access memories, i.e., memories capable of $10^{14}$ programming cycles or more.

Efforts have been underway to create a commercially viable memory device that is both randomly accessed and nonvolatile. To this end, various implementations of such nonvolatile random access memory devices are presently being developed which store data in a plurality of memory cells by structurally or chemically changing the resistance across the memory cells in response to predetermined voltages respectively applied to the memory cells. Examples of such variable resistance memory devices include memories using variable resistance polymers, perovskite, doped amorphous silicon or doped chalcogenide glass.

In a variable resistance memory cell, a first value may be written thereto by applying a voltage having a predetermined level to the memory cell, which changes the electrical resistance through the memory cell relative to the condition of the memory cell prior to the application of the voltage. A second value; or the default value, may be written to or restored in the memory cell by applying a second voltage to the memory cell, to thereby change the resistance through the memory cell back to the original level. The second voltage is in the negative direction of the first voltage and may or may not have the same magnitude as the first voltage. Each resistance state is stable, so that the memory cells are capable of retaining their stored values without being frequently refreshed. In this regard, since the variable resistance materials can be "programmed" to any of the stable resistance values, such variable resistance memory cells are known as programmable conductor random access memory (PCRAM) cells.

The value of the PCRAM cell is read or "accessed" by applying a read voltage to determine the resistance level across the cell. The magnitude of the read voltage is lower than the magnitude of the voltage required to change the resistance of the PCRAM cell. In a binary PCRAM cell, upon determining the resistance level of the PCRAM cell, the detected resistance level is compared with a reference resistance level. Generally, if the detected resistance level is greater than the reference level, the memory cell is determined to be in the "off" state, or storing, for example, a value of "0." On the other hand, if the detected resistance level is less than the reference level, the memory cell is determined to be in the "on" state, or storing, for example, a value of "1."

FIG. 1 generally shows a basic composition of a PCRAM cell 10 constructed over a substrate 12, having a variable resistance material 16 formed between two electrodes 14, 18. One type of variable resistance material may be amorphous silicon doped with V, Co, Ni, Pd, Fe and Mn as disclosed in U.S. Pat. No. 5,541,869 to Rose et al. Another type of variable resistance material may include perovskite materials such as $Pr_{1-x}Ca_xMnO_3$ (PCMO), $La_{1-x}Ca_xMnO_3$ (LCMO), $LaSrMnO_3$ (LSMO), $GdBaCo_xO_y$ (GBCO) as disclosed in U.S. Pat. No. 6,473,332 to Ignatiev et al. Still another type of variable resistance material may be a doped chalcogenide glass of the formula $A_xB_y$, where "B" is selected from among S, Se and Te and mixtures thereof, and where "A" includes at least one element from Group IIIA (B, Al, Ga, In, Tl), Group IVA (C, Si, Ge, Sn, Pb), Group VA (N, P, As, Sb, Bi), or Group VIIA (F, Cl, Br, I, At) of the periodic table, and with the dopant being selected from among the noble metals and transition metals, including Ag, Au, Pt, Cu, Cd, Ir, Ru, Co, Cr, Mn or Ni, as disclosed in U.S. Published Application Nos. 2003/0045054 and 2003/0047765 to Campbell et al. and Campbell, respectively. Yet another type of variable resistance material includes a carbon-polymer film comprising carbon black particulates or graphite, for example, mixed into a plastic polymer, such as that disclosed in U.S. Pat. No. 6,072,716 to Jacobson et al. The material used to form the electrodes 14, 18 can be selected from a variety of conductive materials, such as tungsten, nickel, tantalum, titanium, titanium nitride, aluminum, platinum, or silver, among others.

In FIG. 2, a PCRAM cell 100 is shown to include an access device 102, a programmable conductor memory element 104, and a cell plate 110. The access device 102 is a transistor having a gate 102a coupled to a word line 106 and one terminal (source) 102b coupled to a bit line 108. The other terminal (drain) 102c of the access device 102 is coupled to one end of the programmable conductor memory element 104, while the other end of the programmable conductor memory element 104 is coupled to the cell plate 110. The cell plate 110 may span and be coupled to several other PCRAM cells, and may form the anode of all the memory elements 104 in an array of PCRAM cells. The cell plate 110 is also coupled to a potential source 112.

A representative diagram of the physical structure of the memory cell 100 is shown in FIG. 3. In particular, an n-doped substrate 126 includes a p-doped region 124. Two n-wells 120, 122 are formed in the p-doped region 124. Access device 102 is formed on the surface of the substrate 126 between the two n-wells 120, 122, so that the two n-wells 120, 122 serve as the source 102b and drain 102c respectively, of the access device 102. Word line 106 is formed as a conductive strip extending into the page across the top of access device 102. Bit line 108 is connected directly to the n-well 120 forming the source 102b of the access device-102. Programmable conductor memory element 104 is formed on the substrate with its cathode 114 in contact with n-well 122 and the cell plate 110 (only a portion of which is shown) as its anode. The cell plate 110 of memory element 104 is connected to a potential source 112.

In the conventional operating scheme, when the memory element 104 is idle, the voltage across the anode 110 and the cathode 114 is 0 V. In order to perform any access operations including programming the programmable conductor memory element 104 to the low resistance state, erasing a programmed memory element (i.e., returning the memory element to the high resistance state), or reading the value stored in memory element 104, the word line 106 must be activated by applying a threshold voltage $V_G$. The activated word line which closes the gate 102a of the access device 102 so that an n-channel is formed in the substrate 126 under the gate structure of access device 102 and across the gap between the two n-wells 120, 122 to activate the device 102. Upon activating the access device 102, the memory element 104 can be programmed to the low resistance state by applying a write (positive) voltage having at least the magnitude of a threshold voltage $V_T$ across the memory element 104.

Application of the write voltage may be achieved by raising the potential at the cell plate 110 (anode) relative to the access device drain 102b by applying or raising the voltage at the potential source 112, lowering the potential of the bit line 108, or a combination of both. To erase a programmed memory element 104, a negative voltage having a magnitude of at least a threshold erase voltage is applied between the anode and the cathode of the memory element 104, such that the potential at the potential source 112 is lower than the potential of the bit line 108.

The value stored in the memory element 104 can be read by applying a positive voltage, either by raising the potential at the anode or lowering the potential of the bit line 108 or both, which is less than the voltage level required to program the memory element to the low resistance state.

In a bistable PCRAM cell, the programmable conductor memory element 104 stores, for example, a binary 0 when in a high resistance state, and a binary 1 when in the low resistance state. The memory element 104 is ideally programmed to the low resistance state, e.g., to store a binary 1, by applying a positive voltage having a magnitude at least that of a threshold write voltage, and can be restored to the high resistance state, e.g., to store a binary 0, by applying a negative voltage having a magnitude of at least a threshold erase voltage. Of course, the values "0" and "1" relative to the high and low resistance state, respectively, are user-defined, and thus could be reversed, with the high resistance state representing the value "1" and the low resistance state representing the value "0." The memory element can be nondestructively read by applying a reading voltage having a magnitude of less than the threshold write voltage.

As with volatile RAMs, PCRAMs are arranged as an array of memory cells and are written, erased, and read using a controller. FIG. 4 illustrates a memory device 200 comprising an array of memory cells arranged by tiling a plurality of memory cells 100a-100f together so that the memory cells along any given bit line 108a, 108b do not share a common word line 106a-106c. Conversely, the memory cells 100a-100f along any word line 106a-106c do not share a common bit line 108a-108b. In this manner, each memory cell is uniquely identified by the combined selection of the word line to which the gate of the memory cell access device is connected, and the bit line to which the drain of the memory cell access device is connected.

Each word line 106a-106c is connected to a word line driver 202a-202c via a respective transistor 204a-204c for selecting the respective word line for an access operation. The gates of the transistors 204a-204c are used to selectively couple/decouple the word lines 106a-106c to/from the word line drivers 202a-202c. Similarly, each bit line 108a-108b is coupled to a driver 206a-206b via selector gates 208a-208b. The current and/or resistance of a selected memory cell 100a-100f is measured by sensor amplifiers 210a-210b connected respectively to the bit lines 108a-108b.

For simplicity, FIG. 4 illustrates a memory array having only two rows of memory cells 100 on two bit lines 108a-108b and three columns of memory cells 100 on three word lines 106a-106c. However, it should be understood that in practical applications, memory devices would have significantly more cells in an array. For example, an actual memory device may include several million cells 100 arranged in a number of subarrays.

While the overall operating scheme of the memory device 200 may be similar regardless of the type of variable resistance material used in the memory elements, much research of late has focused on memory devices using memory elements having doped chalcogenide materials as the variable resistance material. More specifically, memory cells having a variable resistance material formed of germanium-selenide glass having a stoichiometry of $Ge_xSe_{100-x}$, with x ranging from about 20 to about 43, have been shown to be particularly promising for providing a viable commercial alternative to traditional DRAMs.

Generally, a chalcogenide PCRAM cell having such stoichiometry has an initial and "off" state resistance of over 100 KΩ (e.g., 1 MΩ). To perform a write operation on a chalcogenide memory cell in its normal high resistive state, a voltage having at least a threshold potential is applied to the electrode serving as the anode, with the cathode held at the reference potential or ground. Upon applying the threshold level voltage, i.e., a write voltage, the resistance across the memory cell changes to a level dramatically reduced from the resistance in its normal state, to a resistance less than 100 KΩ (e.g., 20 KΩ), whereupon the cell is considered to be in the "on" state.

The PCRAM cell retains this new lower level of resistivity until the resistivity is changed by another qualifying voltage level applied to one of the electrodes of the cell. For example, the memory cell is returned to the high resistance state by applying an erase voltage thereto in the negative direction of the voltage applied in the write operation (to achieve the lower resistance state). The erase voltage may or may not be the same magnitude as the write voltage, but is at least of the same order of magnitude.

Although it is not clearly understood what change or changes are induced in the doped chalcogenide material by the application of the threshold potential to result in the stable low resistant state, it is believed that the metal ions incorporated into the chalcogenide material somehow become aligned into a low resistance conductive configuration between the electrodes once the applied voltage reaches the threshold level. At least two theories exist as to the precise nature of the alignment.

In one theory, the metal ions within the chalcogenide material begin to plate on the cathode and progress through the chalcogenide material toward the anode upon the application of the threshold voltage level of a write operation. The metal ions continue to agglomerate until a conductive dendrite or filament is extended between the electrodes to thereby interconnect the top and bottom electrodes to create an electrical short circuit. Upon application of the negative threshold voltage, the dendrite recedes from the anode as the metal ions return to solution in the chalcogenide material or return to the source layer.

In a second theory, when an initial write signal having a threshold positive voltage level is applied to the memory cell, at least one conductive channel is formed in the chalcogenide material, and the metal ions are caused to agglomerate along the channels(s), thereby lowering the electrical resistance across the cell. Upon application of an erase signal having a negative threshold voltage level to the cell, the conductive channel(s) remain in place, but the metal ions are caused to move away from the conductive channel(s), thereby raising the electrical resistance across the cell. Subsequent write signals cause the metal ions to re-agglomerate along the channel(s). The resistance through the cell in the write and erase states is thus determined by the amount of metal ions agglomerated along the channel(s).

When written to the low resistance state, chalcogenide PCRAM cells can retain this state for several hours, days, even weeks. In this regard, such PCRAM devices are relatively non-volatile as compared to DRAM devices. However, while chalcogenide PCRAM cells in the high resistance state are completely non-volatile, PCRAM cells written to the low resistance state will gradually lose their conductivity across the chalcogenide glass layer and drift towards the high resistance state after an extended period of time. In particular, it has been found that such chalcogenide PCRAM devices which are written according to high speed algorithms, i.e., using write voltages each having a pulse width of less than 100 ns, have a tendency to gradually lose their low resistance characteristic over time, e.g., a week. It is desirable to use such high speed algorithms to write PCRAM devices to accommodate the demands of current operating speeds in state-of-the-art processors. Accordingly, PCRAM memory devices operated using high speed algorithms should be intermittently refreshed to maintain optimal operation of the PCRAM memory devices.

Refresh operations are well known in DRAM devices. Specifically, in DRAM devices memory cells must be refreshed frequently, e.g., every 100 milliseconds, and regardless of the value stored in each cell. Additionally, DRAM cells are refreshed with every read operation. PCRAM cells, on the other hand, only require refreshing on a much more sporadic basis, e.g., once every several days to once per week. Moreover, only PCRAM cells written to the low resistance state need periodic refreshing, since PCRAM cells in the high resistance state are not at risk of losing their stored values. One feature resulting from these characteristics of PCRAM devices is that PCRAM devices do not require the dedicated circuitry necessary in DRAM devices to perform the refresh operations.

U.S. application Ser. No. 09/941,648, co-assigned to the assignee of the present invention, and the entire disclosure of which is hereby incorporated by reference, discloses a system and method for refreshing PCRAM memory cells by applying a positive voltage in the form of a sweep voltage, a pulse voltage, or a step voltage to the cells. The refresh voltages are applied at a magnitude less than that capable of writing a cell to the low resistance state, so that cells in the high resistance state are not affected by the refresh voltages.

BRIEF SUMMARY OF THE INVENTION

The present invention provides a method for refreshing PCRAM cells and entire arrays of PCRAM cells more efficiently than what is currently being done by using a simple refresh scheme which does not require separate control and application of discrete refresh voltages to the PCRAM cells in an array. In particular, according to the present invention, the PCRAM array structure is constructed to allow PCRAM cells written to the low resistance state to be refreshed by a controlled leakage current to the anode of each cell. In one embodiment, the leakage current flows from the bit lines and across the access device for each cell. In another embodiment, the leakage current flows to the cells through a doped substrate or doped regions of a substrate on which each cell is formed.

The magnitude of the leakage current through the PCRAM cells is lower than that required to write the PCRAM cells to the low resistance state, but above the baseline current through the cells due to the voltage level maintained at the anode of the cells so as to enable the leakage current to flow continuously across the channel region of the access device or through the substrate, respectively. Accordingly, only those cells in the low resistance state are refreshed by the leakage current, while cells in the high resistance state are unaffected by the refresh operation.

These and other features and advantages of the invention will be more apparent from the following detailed description, which is provided in connection with the accompanying drawings and illustrate exemplary embodiments of the invention.

DETAILED DESCRIPTION OF THE INVENTION

In the following detailed description, reference is made to various specific structural and process embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a plastic or a semiconductor substrate that has an exposed substrate surface. Semiconductor substrates should be understood to include silicon, silicon-on-insulator (SOI), silicon-on-sapphire (SOS), doped and undoped semiconductors, epitaxial layers of silicon supported by a base semiconductor foundation, and other semiconductor structures. When reference is made to a substrate or wafer in the following description, previous process steps may have been utilized to form regions or junctions in or over the base semiconductor or foundation.

The term "non-volatile," when used in connection with the described memory device is intended to include any memory device which is generally capable of maintaining its memory state after power is removed from the device for a prolonged period of time (e.g., minutes, days, or weeks), and which may need occasional refreshing to maintain its stored value. As used herein, non-volatile memory devices are also intended to include such memory devices consistent with the foregoing and which are capable of retaining stored data after the power source is disconnected or removed.

The term "variable resistance material" is intended to include any material usable in programmable conductor memory (PCRAM) elements and/or non-volatile memory elements which exhibit a resistance change in response to an applied stimulus, e.g., a voltage.

Figure 1:
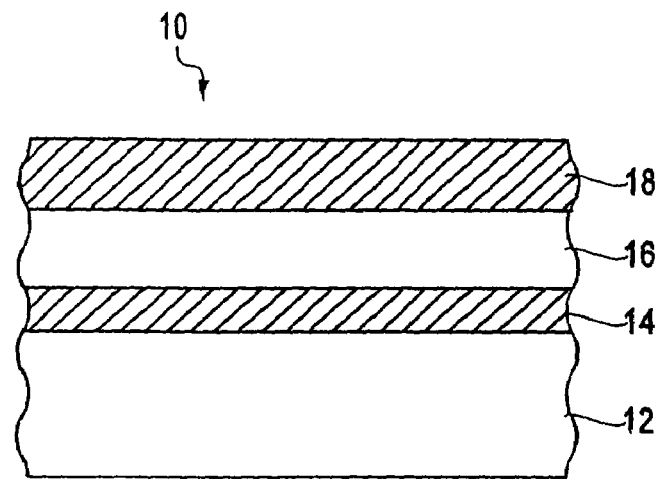
FIG. 1 is an illustration of a programmable conductor random access memory element as known in the art.
Figure 3:
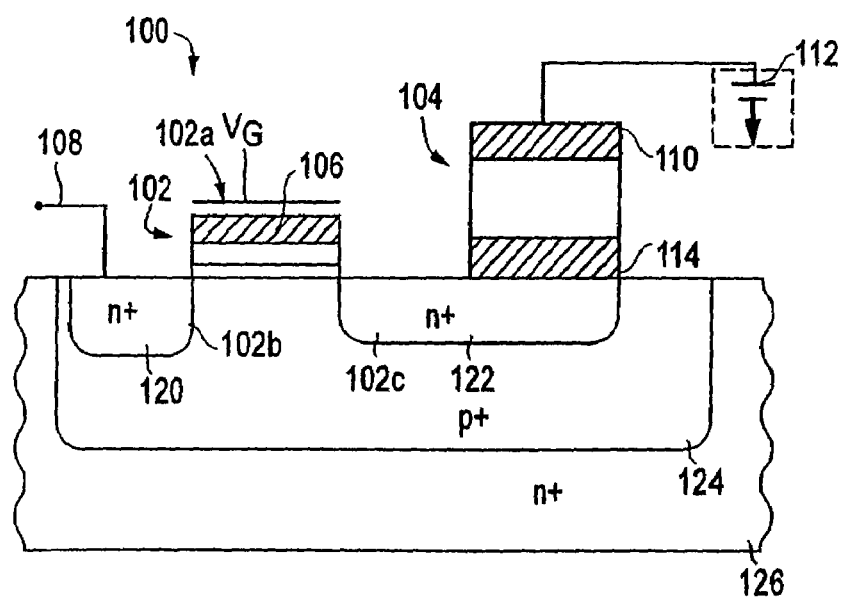
FIG. 3 is a structural diagram of a PCRAM cell according to the present invention.
Figure 2:
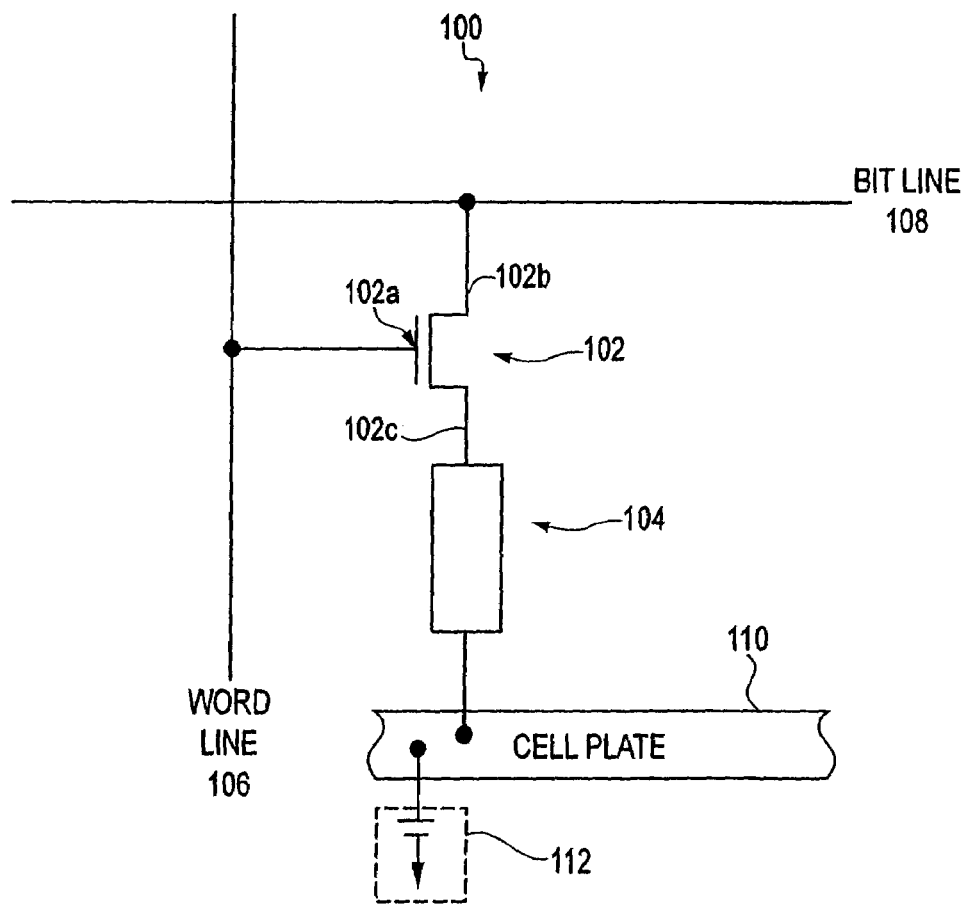
FIG. 2 is a schematic diagram of a PCRAM cell previously developed in the art.
Figure 4:
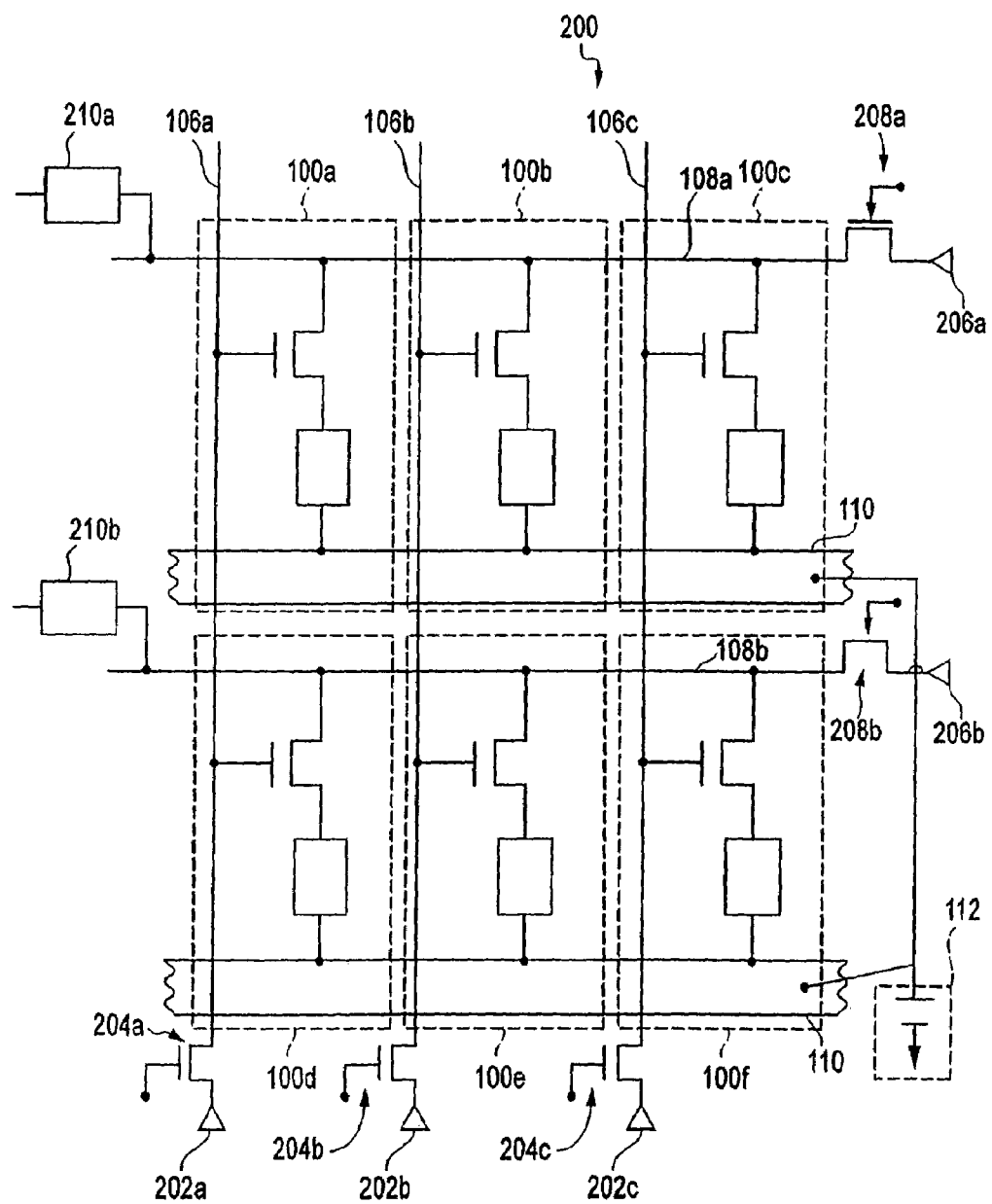
FIG. 4 is a schematic diagram of an array of PCRAM cells previously developed in the art.

The present invention is applicable in connection with a PCRAM array such as that shown and described above with reference to FIGS. 2 to 4. However, although FIG. 4 appears to show a separate cell plate for each row of cells 100a-100c and 10d-100f, in the present invention, the cell plate is preferably formed as a common anode to each memory element in the array 200 and is connected to voltage source 112. Also, while the access device 102, as well as the other transistors shown in FIGS. 2 to 4, are depicted as N-type CMOS transistors, it should be understood that P-type CMOS transistors may be used as long as the corresponding polarities of the other components and voltages are modified accordingly. Furthermore, while the present invention is disclosed and described in connection with memory devices having doped chalcogenide glass as the variable resistance material in the programmable conductor memory elements 104, the invention also encompasses PCRAM devices incorporating any other type of variable resistance memory elements having at least two stable resistive states known to those with ordinary skill in the art, such as the conductive polymer film memory elements, the perovskite memory elements, or the amorphous silicon memory elements disclosed above.

Figure 5:
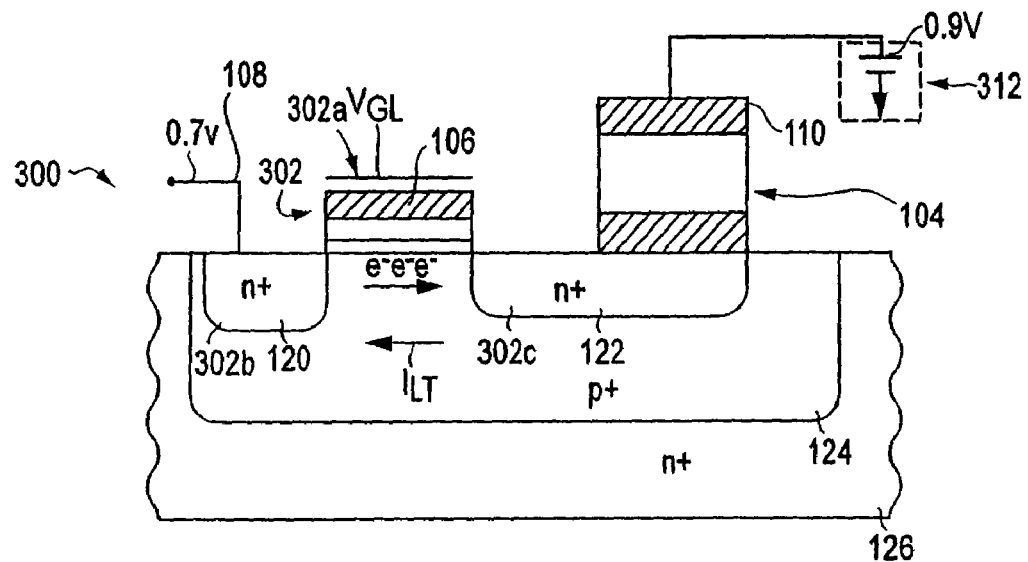
FIG. 5 shows an exemplary structural diagram of a PCRAM cell in a refresh operation according to a first embodiment of the present invention.

According to a first exemplary embodiment of the present invention, a refresh operation is simultaneously performed on each memory cell in an array by effecting a leakage current across the access transistor from the memory element. A cross-sectional view of a memory cell 300 in accordance with this exemplary embodiment is shown in FIG. 5. The structure shown in FIG. 5 is very similar to the structure of the memory cell 100 shown in FIG. 3 and discussed above, except that access transistor 102 is replaced with access transistor 302 having a gate 302a, source 302b and drain 302c, and potential source 112 is replaced with potential source 312. While most transistors are produced with the goal of reducing or eliminating current flow across the channel between the source and the drain when the transistor gate is off, transistor 302 in this embodiment is intentionally designed to allow some small current leakage across the channel when the transistor is off.

In the access transistor 302 according to the present embodiment, the threshold activation voltage $V_{GL}$ is designed to produce a leakage current across the transistor gate 302a when the transistor is off and the drain side 302c is at a potential of 0.2 V relative to the source 302b. For example, this may be accomplished by setting the threshold activation voltage $V_{GL}$ to approximately 0.6-0.7 V, which is a relatively low value and thus renders the transistor particularly susceptible to leakage current. The threshold activation voltage $V_{GL}$ may be determined during the manufacturing process of the access transistor by manipulating any of various factors, including adding a dopant into the channel region, forming a short channel length, providing a thin oxide layer between the gate and the channel, inter alia.

In a preferred application of the invention, the voltage at potential source 312 and at the bit line 108 are both held at a nominal value of 0.7 V when the memory cell is idle, resulting in 0 V potential difference across the memory cell. Referring now to FIG. 5, the refresh operation is performed by driving the voltage at potential source 312 up to 0.9 V while the bit line is maintained at 0.7 V, to thereby achieve a potential difference of +0.2 V across the channel under the access transistor, which thereby induces a leakage current $I_{LT}$ to flow across the channel. While the exemplary embodiment achieves the leakage current $I_{LT}$ with a potential difference of +0.2 V between the anode 110 and the bit line 108, a potential difference of at least 10% over the baseline voltage 0.7 V and up to a potential difference of about +0.4 V may be safely applied to obtain the leakage current before risking a breakdown of the access transistor 302. For example, in another exemplary embodiment of the invention, the anode is driven up to a voltage of between about 0.79 V and about 0.85 V. Generally, the greater the potential difference across the channel, the greater the leakage current (up to the breakdown voltage of the transistor), and the faster the cells are refreshed. However, it is preferable to keep the leakage current below the voltage level necessary to program the cells. Preferably, the leakage current is maintained as a constant flow through all the memory cells 100 of the array 200 when no access operations (read, write, erase) are being performed on any of the memory cells in the array 200.

Figure 6:
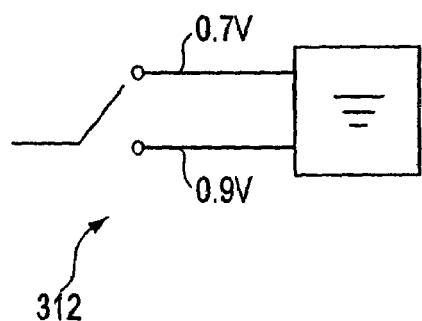
FIG. 6 illustrates a switch structure for use in the PCRAM cell shown in FIG. 5.

When an access operation is to be performed on a memory cell 300, the access transistor 302 is turned on by applying a voltage VGL the potential source 312 is switched from the higher voltage level, e.g., 0.9 V, down to the baseline voltage, e.g., 0.7 V, and the voltage of the appropriate bit line 108 is set to an appropriate value to perform the desired operation. For example, a write operation is performed by setting the bit line to −0.5 V, to thereby obtain a potential difference of +1.2 V across the memory element 104. Similarly, a read operation is performed by setting the bit line to −0.1 V, to thereby obtain a potential difference of +0.8 V across the memory element 104. An erase operation, on the other hand, is performed by raising the voltage of the bit line to +1.7 V, to apply a voltage of −1.0 V across the memory element 104. The voltage at potential source 112 may be selected by means of a switch which alternatively connects to a voltage of +0.7 V or +0.9 V, for example, as shown in FIG. 6.

For at least PCRAM cells in which the variable resistance material is a doped chalcogenide material, only cells programmed to the low resistance state require refreshing. By producing a low-level leakage current, e.g., in the range of 1-100 picoamps, across the access transistor, the leakage current only flows through the memory cells programmed to the low resistance state. Memory cells which are in the high resistance state are unaffected by this refresh operation because the potential applied to the anode plate of the memory cells is below the threshold level to program these cells to the low resistance state. Moreover, the high resistance across these cells effectively blocks any leakage current from flowing through the cells.

Although not wishing to be bound by any particular theory, it is believed that the amount of leakage current flowing through the memory element and the transistor channel due to the raised potential at the anode as discussed above serves to reinforce the conductive path(s) between the electrodes and which are present in the low resistance state. It is believed that the leakage current counteracts the natural tendency of the conductive ions in the chalcogenide material to come out of alignment and disperse throughout the chalcogenide material.

Figure 7:
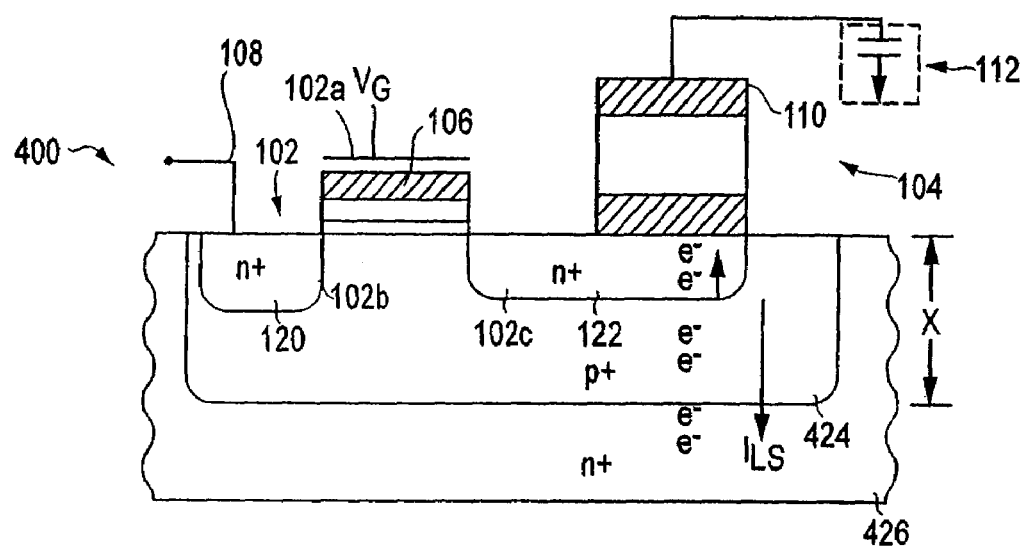
FIG. 7 shows an exemplary structural diagram of a PCRAM cell in a refresh operation according to a second embodiment of the present invention.

In a second embodiment of the present invention, an array of memory cells is refreshed by a leakage current through the substrate, i.e., current flows from the common anode of the memory elements, through the respective memory elements, and through the substrate on which the memory elements are formed. FIG. 7 shows a cross-sectional view of a memory cell 400 in which a refresh operation is performed by producing a leakage current $I_{LS}$ through the substrate. The structure of memory cell 400 is similar to that of memory cell 100 of FIG. 3 except that the substrate 126 is exchanged for substrate 426, and the p-well region 124 is substituted with p-well region 424.

In this exemplary embodiment of FIG. 7, leakage current is effected through the substrate by manufacturing the substrate 426 so that the depth "x" of the p-well 424 allows leakage between n-well 122 and the main portion of the substrate 126. Specifically, the p-well 424 is preferably formed to be less than 4000 Å. In contrast, in typical semiconductor structures in which it is desired to reduce leakage through the substrate, the depth of the p-well is formed to be at least 4000-5000 Å.

With the substrate constructed as described above, leakage current flows through the substrate when a potential difference exists between the common anode 110 and the base of the substrate 426, i.e., ground, up to a breakdown voltage of about 5.5 V. Hence, the presence, absence or amount of a potential difference between the level of the potential source 112 applied to the anode plate 110 and the bit line 108 is not a determining factor in this refresh operation, although leakage current may still occur across the channel under the access transistor simultaneously with the leakage through the substrate. Preferably, however, the level at potential source 112 is operated similarly to the previously described embodiment, in which the potential at the anode of the memory cell is driven to a voltage level in the range of from about 0.79 V to about 0.9 V for the refresh operation, and changed back to 0.7 V for read, write, and erase operations.

In addition to providing the capability to refresh an entire array of memory cells at one time, the embodiment of refreshing the memory cells by leakage current through the substrate as shown in FIG. 7 offers another advantage in that memory cells not currently being read, written or erased can still be refreshed during the access operation(s) of the other memory cell(s), since the anode of the memory cells is still held at a higher potential than the potential at the base of the substrate during each of the access operations.

In each embodiment of the invention described herein, PCRAM cells which have been programmed to a low resistance state in an array can be refreshed without disturbing any of the cells in the high resistance state since the high resistance associated with the unprogrammed cells requires an increased the voltage potential across it to cause sufficient leakage current. Thus, no prior knowledge of the states of each of the cells is necessary prior to conducting a refresh operation.

The present invention allows large memory arrays to be quickly and effectively refreshed by dividing a large array into smaller subarrays with each sub-array sharing a common anode plate. The sub-array anode plates can be driven sequentially to produce leakage current to refresh their respective cells using software or as presented on some hardware driven scheme depending on the rate of refresh desired. In each array or subarray, the p-well may be formed in the substrate in common to all the memory cells in the array, or a separate p-well may be formed in the substrate for each memory cell in the array.

Figure 8:
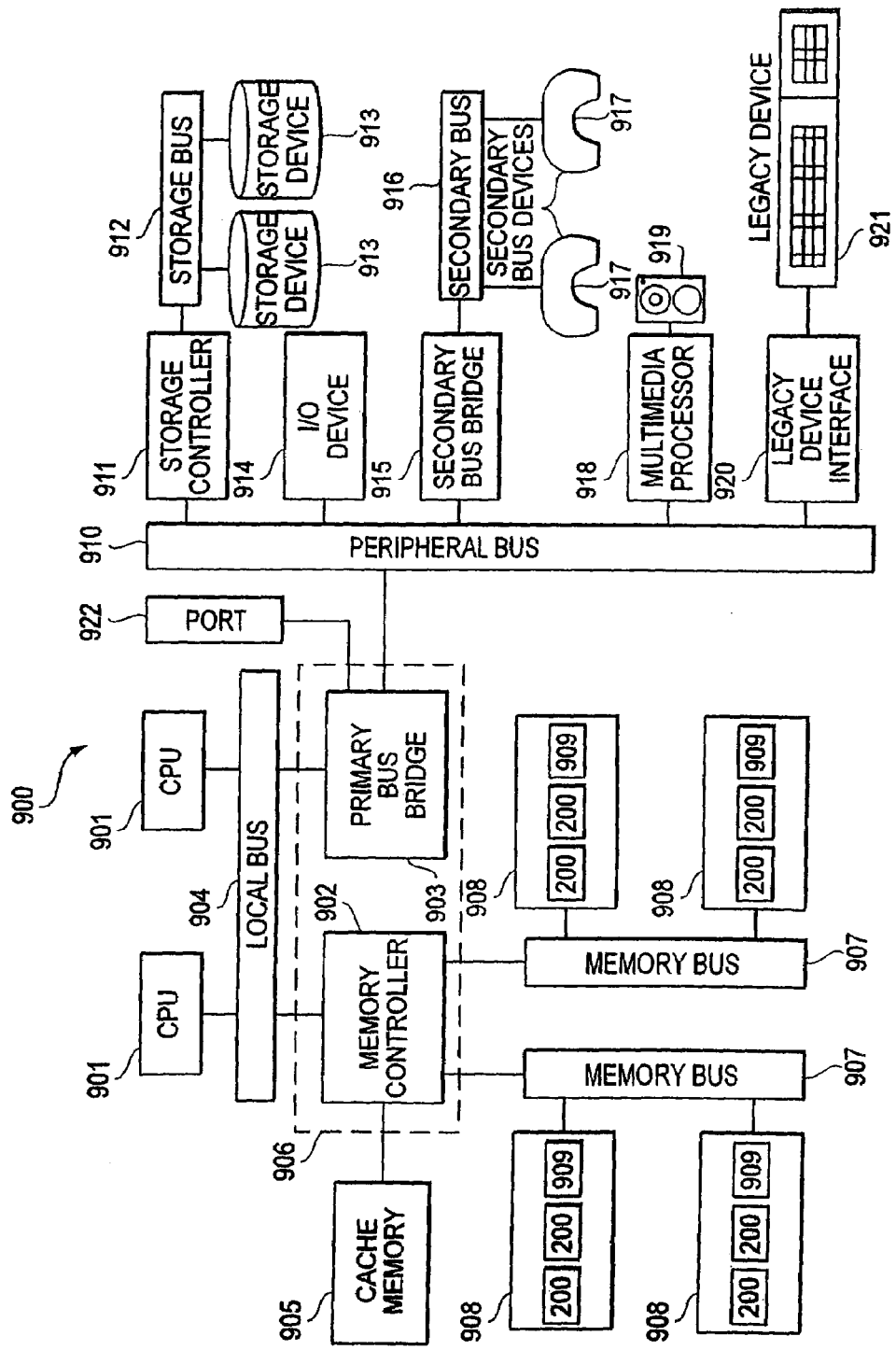
FIG. 8 shows a processor system incorporating a memory device having the refresh scheme according to the present invention.

FIG. 8 illustrates an exemplary processing system 900 incorporating a memory device as describe above in connection with FIGS. 5-7. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device as described above in connection with FIGS. 5-7. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915 communicating with a secondary bus 916, a multimedia processor 918, and a legacy device interface 920. The primary bus bridge 903 may also be coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be a local area network interface, such as an Ethernet card. The secondary bus bridge 915 may be used to interface additional devices via another bus to the processing system. For example, the secondary bus bridge may be a universal serial port (USB) controller used to couple USB devices 917 via to the processing system 900. The multimedia processor 918 may be a sound card, a video capture card, or any other type of media interface, which may also be coupled to additional devices such as speakers 919. The legacy device interface 920 is used to couple at least one legacy device 921, for example, older styled keyboards and mice, to the processing system 900.

The processing system 900 illustrated in FIG. 8 is only an exemplary processing system with which the invention may be used. While FIG. 8 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory arrays 200. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the invention is described in connection with a doped chalcogenide material as the variable resistance material in the memory elements, it should be readily apparent that the present invention is also applicable to other non-volatile or semi-volatile variable resistance memory devices including those incorporating any other type of variable resistance material. Also, the scope and applicability of the present invention not only encompasses the structure of the PCRAM element expressly disclosed herein, but also other variable resistance memory elements including PCRAM elements having different stoichiometric compositions of the disclosed materials, and those having a different number of layered components from that of the disclosed embodiment. Accordingly, the invention is not limited by the foregoing description or drawings, but is only limited by the scope of the appended claims.

What is claimed as new and desired to be protected by Letters Patent of the United States is:

1. A method for refreshing a programmed programmable conductor memory cell which includes at least a programmable conductor memory element formed on a substrate, the method comprising:
    applying a voltage to the programmed memory element to thereby induce a leakage current of approximately between 1 and 100 picoamps through the memory element and the substrate.

2. The method according to claim 1, wherein the act of applying a voltage to the programmed memory element comprises applying a voltage in the range of approximately 0 V to about 5.5 V.

3. The method according to claim 1, wherein the voltage is applied continuously.

4. A programmable conductor memory cell comprising:
    a substrate comprising:
    a first well of a first conductivity type in electrical contact with the second electrode, and
    a second well of a second conductivity type formed surrounding the first well, the second well having a depth of less than about 4000 Å,
    wherein a remaining thickness of the substrate surrounding the second well is of the first conductivity type; and
    a programmable conductor memory element formed in electrical contact with the substrate,
    wherein the substrate is formed such that when the memory element is in a programmed state, application of a potential difference between the memory element and the substrate induces a leakage current through the memory element and through the substrate.

5. The memory cell according to claim 4, wherein
    the memory element includes a first electrode and a second electrode; and
    application of a potential difference between the first electrode of the memory element and the substrate when the memory element is in a programmed state induces a leakage current which flows from the first electrode through the memory element, through the first well, through the second well, and then through the remaining thickness of the substrate.

6. The programmable conductor memory cell according to claim 5, wherein the first conductivity type is n-type, the second conductivity type is p-type, the first electrode is an anode, and the second electrode is a cathode.

7. The memory cell according to claim 5, further comprising:
an access transistor formed on the substrate, wherein the first well serves as a drain of the access transistor; and
a voltage source connected to the first electrode,
wherein when the memory element is in a programmed state, application of a voltage from the voltage source to the first electrode enables the leakage current to flow from the first electrode through the memory element, through the first well, through the second well, and then through the remaining thickness of the substrate.

8. An array of programmable conductor memory cells, comprising:
a substrate;
a plurality of memory cells formed on the substrate and arranged in rows and columns, wherein each row of memory cells is connected along a respective bit line and each column of memory cells is connected along a respective word line, wherein each memory cell comprises a programmable conductor memory element formed in electrical contact with the substrate,
wherein the substrate is formed such that when at least one of the memory elements in the array is in a programmed state, application of a potential difference between each of the at least one programmed memory element and the substrate induces a leakage current through each of the at least one programmed memory element and through the substrate; and
a cell plate forming a common electrode to each memory element in the array.

9. The array according to claim 8, further comprising:
a voltage source connected to the common anode, wherein application of a voltage from the voltage source to the cell plate induces a leakage current to flow through each of the at least one programmed memory element in the array and through the substrate.

10. The array according to claim 8, wherein
each memory element in the array includes a first electrode and a second electrode; and
the substrate includes
a first well of a first conductivity type for each memory cell, each first well being in electrical contact with the second electrode of the respective memory element of the corresponding memory cell, and
a common second well of a second conductivity type formed surrounding each of the respective first wells, the second well having a depth of less than about 4000 Å,
a remaining thickness of the substrate surrounding the common second well is of the first conductivity type; and
application of a potential difference between the first electrode of each of the at least one programmed memory element and the substrate induces a leakage current which flows from the first electrode through each respective programmed memory element, through the corresponding first well, through the second well, and then through the remaining thickness of the substrate.

11. The array according to claim 10, wherein the first conductivity type is n-type, the second conductivity type is p-type, the first electrode of each memory element is an anode formed as a common cell plate to each memory element in the array, and the second electrode of each memory element is a cathode.

12. The array according to claim 10, wherein
the first electrode of each memory element in the array is a common electrode formed as a cell plate for each memory element in the array,
each memory cell further comprises a respective access transistor formed on the substrate, such that the respective first well serves as a drain of the access transistor,
a voltage source connected to the common first electrode, and
application of a voltage from the voltage source to the common first electrode enables the leakage current to flow from the common first electrode through each of the at least one programmed memory element, through the corresponding first well, through the second well, and then through the remaining thickness of the substrate.

13. The array according to claim 8, wherein
each memory element in the array includes a first electrode and a second electrode; and
the substrate includes
a first well of a first conductivity type for each memory cell, each first well being in electrical contact with the second electrode of the respective memory element of the corresponding memory cell, and
for each first well, a second well of a second conductivity type surrounding the respective first well, each second well having a depth of less than about 4000 Å,
a remaining thickness of the substrate surrounding each of the second wells is of the first conductivity type; and
application of a potential difference between the first electrode of each of the at least one programmed memory element and the substrate induces a leakage current which flows from the first electrode through each respective programmed memory element, through the corresponding first well, through the corresponding second well, and then through the remaining thickness of the substrate.

14. The array according to claim 13, wherein the first conductivity type is n-type, the second conductivity type is p-type, the first electrode of each memory element is an anode formed as a common cell plate to each memory element in the array, and the second electrode of each memory element is a cathode.

15. The array according to claim 13, wherein
the first electrode of each memory element in the array is a common electrode formed as a cell plate for each memory element in the array,
each memory cell further comprises a respective access transistor formed on the substrate, such that the respective first well serves as a drain of the access transistor,
a voltage source connected to the common first electrode, and
application of a voltage from the voltage source to the common first electrode enables the leakage current to flow from the common first electrode through each of the at least one programmed memory element, through the corresponding first well, through the second well, and then through the remaining thickness of the substrate.

16. A processing system, comprising:
a processor for receiving and processing data;
at least one memory array for exchanging data with the processor; and
a memory controller for managing memory access requests from the processor to the at least one memory array,
wherein each of the at least one memory array includes:

a substrate;

a plurality of memory cells formed on the substrate and arranged in rows and columns, wherein each row of memory cells is connected along a respective bit line and each column of memory cells is connected along a respective word line, wherein each memory cell comprises a programmable conductor memory element formed in electrical contact with the substrate, wherein the substrate is formed such that when at least one of the memory elements in the array is in a programmed state, application of a potential difference between each of the at least one programmed memory element and the substrate induces a leakage current through each of the at least one programmed memory element and through the substrate; and a cell plate forming a common electrode to each memory element in the respective array.

17. The processing system according to claim 8, wherein each of the at least one array further comprises:

a voltage source connected to the common anode, wherein application of a voltage from the voltage source to the cell plate induces a leakage current to flow through each of the at least one programmed memory element in the respective array and through the substrate.

* * * * *